United States Patent
Hagimoto et al.

(10) Patent No.: US 10,284,105 B2
(45) Date of Patent: May 7, 2019

(54) POWER CONVERTER

(71) Applicant: Honda Motor Co., Ltd., Tokyo (JP)

(72) Inventors: Takahiro Hagimoto, Saitama (JP); Takahiro Uneme, Saitama (JP); Yuko Yamada, Saitama (JP)

(73) Assignee: Honda Motor Co., Ltd., Tokyo (JP)

( * ) Notice: Subject to any disclaimer, the term of this patent is extended or adjusted under 35 U.S.C. 154(b) by 0 days.

(21) Appl. No.: 15/710,839

(22) Filed: Sep. 21, 2017

(65) Prior Publication Data
US 2018/0083548 A1   Mar. 22, 2018

(30) Foreign Application Priority Data

Sep. 21, 2016   (JP) .................................. 2016-184418

(51) Int. Cl.

| | |
|---|---|
| *H05K 7/20* | (2006.01) |
| *H02M 7/00* | (2006.01) |
| *H01L 23/473* | (2006.01) |
| *H01L 21/48* | (2006.01) |
| *H02M 7/48* | (2007.01) |
| *H05K 7/02* | (2006.01) |
| *H05K 7/14* | (2006.01) |
| *H02M 7/537* | (2006.01) |
| *H02P 27/06* | (2006.01) |

(52) U.S. Cl.
CPC ........ *H02M 7/003* (2013.01); *H01L 21/4878* (2013.01); *H01L 23/473* (2013.01); *H02M 7/48* (2013.01); *H05K 7/023* (2013.01); *H05K 7/1432* (2013.01); *H05K 7/2089* (2013.01); *H05K 7/20927* (2013.01); *H02M 7/537* (2013.01); *H02P 27/06* (2013.01)

(58) Field of Classification Search
CPC .................................................. H05K 7/20927
See application file for complete search history.

(56) References Cited

U.S. PATENT DOCUMENTS

| | | | | |
|---|---|---|---|---|
| 7,812,443 | B2 * | 10/2010 | Tokuyama | ............ H01L 23/473 |
| | | | | 257/706 |
| 7,968,925 | B2 * | 6/2011 | Tokuyama | ............ H01L 23/473 |
| | | | | 257/299 |

(Continued)

FOREIGN PATENT DOCUMENTS

| | | | | |
|---|---|---|---|---|
| JP | 2015-201981 | | 11/2015 | |
| WO | WO-2015053140 | A1 * | 4/2015 | ......... H01L 23/3677 |

(Continued)

*Primary Examiner* — Robert J Hoffberg
(74) *Attorney, Agent, or Firm* — JCIPRNET (57) ABSTRACT

A power converter (1) includes: planar semiconductor modules (10) each having a resin sealing part (16) in which a semiconductor element (11), conductive members (12, 13, and 14), and a signal terminal (15) are sealed with a resin; a cooler (20) that holds the plurality of semiconductor modules (10) in a laminated manner; and a cover (30) that covers the semiconductor modules and the cooler, wherein at least a part of the resin sealing part (16) and the cooler (20) are supported by support media (41 and 42) that extend from the cover (30) so that facing parts of the resin sealing part and the cooler with respect to the cover (30) is positioned in proximity to the cover, and the conductive members and the signal terminal protrude from the resin sealing part in a direction away from the cover.

10 Claims, 12 Drawing Sheets

(56) References Cited

U.S. PATENT DOCUMENTS

| | | | |
|---|---|---|---|
| 8,451,609 B2* | 5/2013 | Olesen | H01L 23/473 |
| | | | 165/80.4 |
| 9,773,759 B2* | 9/2017 | Hirasawa | B60L 11/1874 |
| 9,992,915 B2* | 6/2018 | Shimura | H01L 23/3677 |
| 10,064,310 B2* | 8/2018 | Tanie | H01L 23/28 |
| 10,080,313 B2* | 9/2018 | Shintani | H01L 23/043 |
| 2017/0084515 A1* | 3/2017 | Shintani | H01L 23/427 |
| 2017/0223875 A1* | 8/2017 | Tsuyuno | H05K 7/20927 |
| 2017/0365536 A1* | 12/2017 | Amo | H05K 7/20927 |

FOREIGN PATENT DOCUMENTS

| | | | | |
|---|---|---|---|---|
| WO | WO-2015111211 A1 * | 7/2015 | | H01L 23/043 |
| WO | WO-2016121443 A1 * | 8/2016 | | H05K 7/20927 |

\* cited by examiner

POWER CONVERTER

CROSS-REFERENCE TO RELATED APPLICATION

This application claims the priority benefit of Japan application serial no. 2016-184418, filed on Sep. 21, 2016. The entirety of the above-mentioned patent application is hereby incorporated by reference herein and made a part of this specification.

BACKGROUND OF THE INVENTION

Field of the Invention

The present invention relates to a power converter.

Description of Related Art

Figure 10:
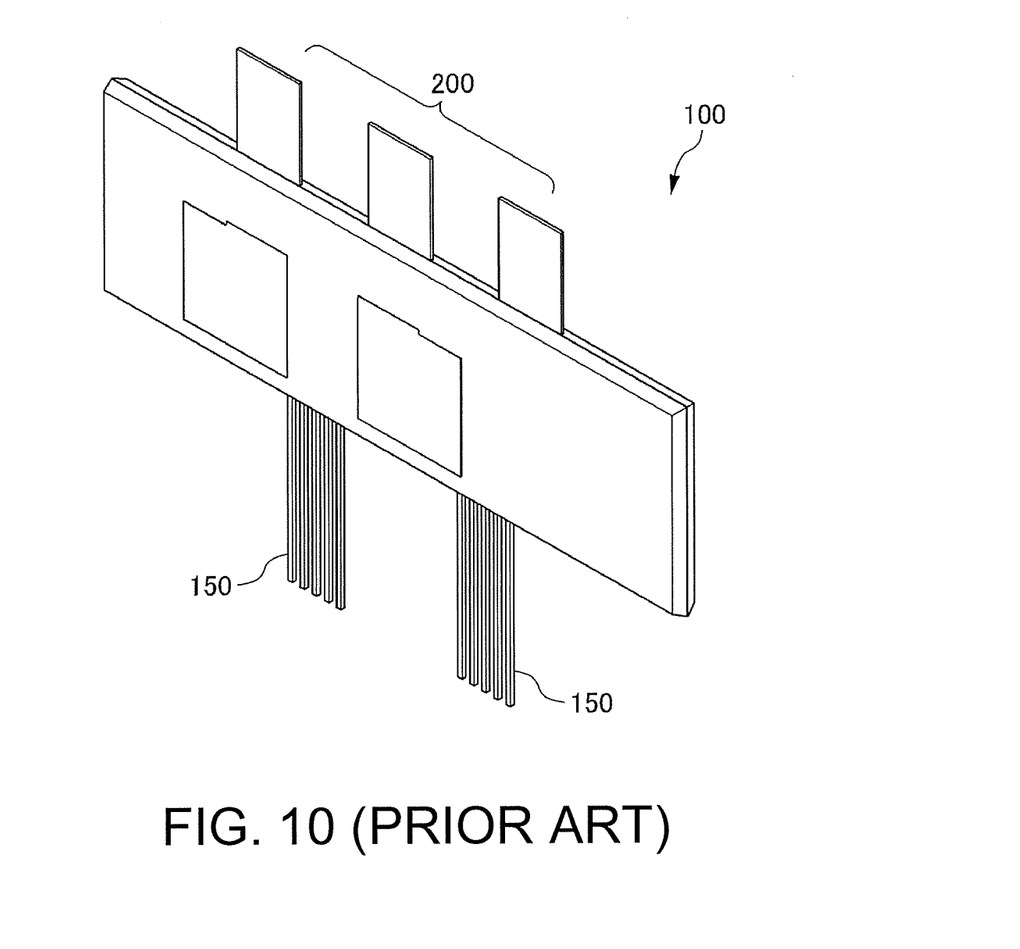
FIG. 10 is a perspective view of a semiconductor module which is a constituent element of a power converter of the related art.
Figure 11:
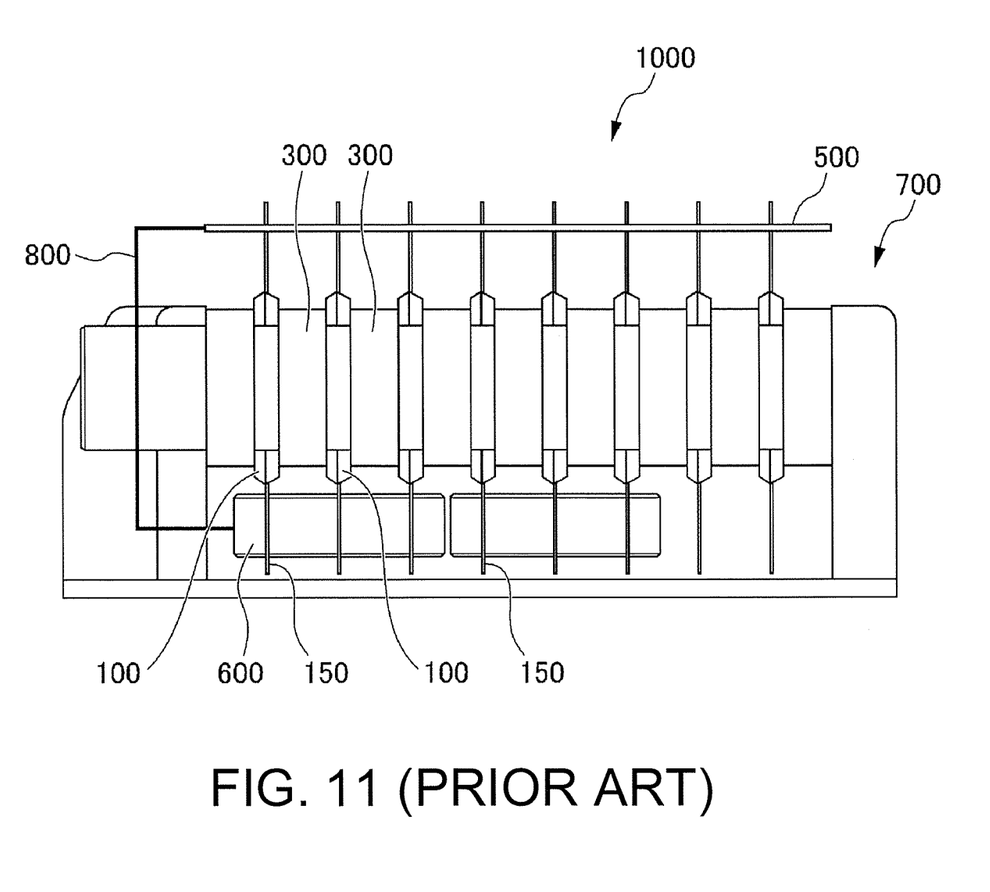
FIG. 11 is a side view of the power converter of the related art.
Figure 12:
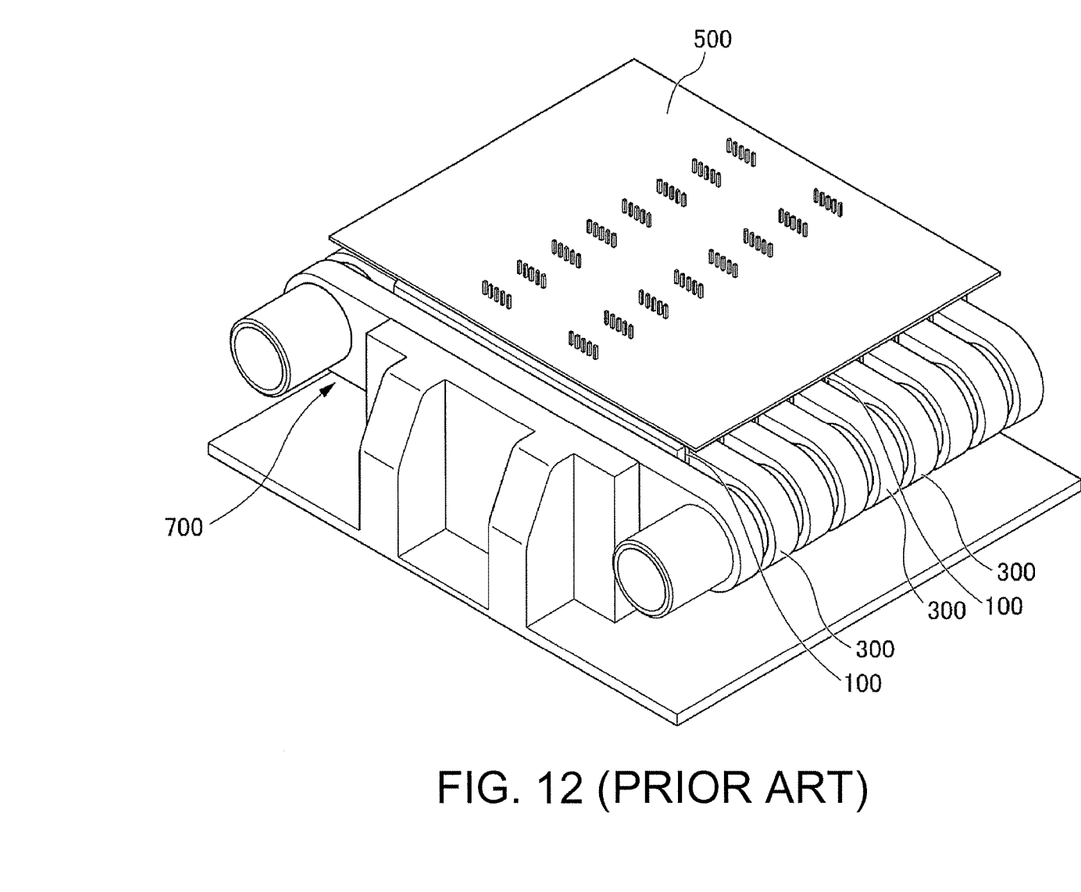
FIG. 12 is a perspective view of the power converter of the related art.

In the past, a power converter 1000 was disclosed to which a power module 100 was applied. Signal pins 150 extend from one side of the power module and are connected to a control board, and bus bar 200 extend from the other side of the power module, as shown in a perspective view of a semiconductor module in FIG. 10. Power modules and a cooler were interposed together in a holding structure 700 of the power converter of the related art shown in FIGS. 11 and 12 (e.g., refer to Patent Literature 1).

PRIOR ART DOCUMENT

Patent Document

[Patent Document 1] Japanese Unexamined Patent Application Publication No. 2015-201981

SUMMARY OF THE INVENTION

However, it is necessary in the power converter of Patent Literature 1 to hold the power module 100 while preventing the signal pins 150 from interfering with other portions, and thus an overhang which is an amount of outward protrusion of portions interposed in the holding structure 700 is large. For this reason, there is concern that vibration resistance may be low, the power module 100 may deviate from a normal position at which the power module is interposed between coolers 300 corresponding thereto, and the power module 100 and the coolers 300 may break due to brittleness that may be caused by vibration.

In addition, in the power converter of Patent Literature 1, the signal pins 150 that are connected to the control board 500 extend from one side of the power module 100, the bus bar 200 extend from the other side thereof as described above, and it is not possible to design wiring such as a harness 800 for connecting an output of a sensor 600, which detects a current flowing through the bus bar 200 that is a high-voltage conductor, to the control board 500 having a shortest distance. Thus, a volume of the power converter increases, and the accuracy of the current sensor is low because the longer wiring picks up noise.

The present invention has been conceived in view of the above circumstances provides a power converter having excellent vibration resistance and a small size, in which an overhang of power modules protruding from a portion sandwiched by a holding structure can be reduced and with which the influence of noise can be minimized.

(1) A power converter (e.g., a power converter 1 which will be described below) which includes: planar semiconductor modules (e.g., semiconductor modules 10 which will be described below) each having a resin sealing part (e.g., a resin sealing part 16 which will be described below) in which a semiconductor element (e.g., a semiconductor chip 11 which will be described below), conductive members (e.g., conductive members 12, 13, and 14 which will be described below), and a signal terminal (e.g., signal terminal 15 which will be described below) are sealed with a resin; a cooler (e.g., a cooler 20 having a plurality of refrigerant tube parts 21 which will be described below) that holds the plurality of semiconductor modules in a laminated manner; and a cover (e.g., a cover 30 having a bottom plate part 31 which will be described below) that covers the semiconductor modules and the cooler, in which at least a part of the resin sealing part and the cooler are supported by support media (e.g., one support medium 41 and another support medium 42 which will be described below) that extend from the cover so that a facing part of the resin sealing part and the cooler with respect to the cover is positioned in proximity to the cover, and the conductive members and the signal terminal protrude from the resin sealing part in the direction away from the cover.

According to the power converter described in (1) above, the conductive members and the signal terminal extend in a direction away from the cover, the resin sealing part and the cooler are disposed in proximity to the cover, and thus an overhang is small and the vibration resistance can be improved. Accordingly, it is possible to prevent semiconductor modules from deviating from normal positions and the semiconductor modules and the cooler from breaking.

(2) The power converter described in (1) which further includes: a control board (e.g., a control board 50 which will be described below) that is disposed in the protruding direction of the signal terminal to control driving of the semiconductor modules; and a current sensor that is disposed between the cooler and the control board, in which the current sensor is connected to the conductive members of the plurality of semiconductor modules, and the current sensor and the control board are connected by a harness (e.g., a harness 70 which will be described below).

According to the power converter described in (2), in the power converter described in (1) in particular, the harness can be shortened by disposing the current sensor and the control board in proximity to each other, and consequently the noise of a signal propagating through the harness can be reduced.

(3) The power converter described in (1) or (2), in which the semiconductor element includes two semiconductor that are a first semiconductor element and a second semiconductor element (e.g., a first semiconductor chip 11a and a second semiconductor chip 11b which will be described below), the conductive members include a positive conductive member (e.g., a P busbar 12 which will be described below), a negative conductive member (e.g., an N busbar 13 which will be described below), and an output conductive member (e.g., an out-bus 14 which will be described below), the signal terminal includes a first signal terminal (e.g., a first signal pin 15a which will be described below) that drives the first semiconductor element and a second signal terminal (e.g., a second signal pin 15b which will be described below) that drives the second semiconductor element in a planar direction.

According to the power converter described in (3), resin sealing using a mold is easy in the power converter described in (1) or (2) in particular.

(4) The power converter described in (3), which further includes: a capacitor positive conductive member (e.g., a capacitor positive conductive member 120 which will be described below) that connects the positive electrodes of capacitors (e.g., a parallel connection body of a first capacitor 81 and a second capacitor 82 which will be described below) and the positive conductive terminals of the positive conductive members of the plurality of semiconductor modules; and a capacitor negative conductive member (e.g., a capacitor negative conductive member 130 which will be described below) that connects the negative electrodes of the capacitors and the negative conductive terminals of the negative conductive members of the plurality of semiconductor modules, in which the capacitor positive conductive member and the capacitor negative conductive member extend in a laminating direction and face each other.

According to the power converter described in (4), by disposing the capacitor positive conductive member and the capacitor negative conductive member to face each other, magnetic fields generated by currents flowing through the two conductive members can be differentiated, inductance is eliminated, and therefore emission of noise is reduced in the power converter described in (3) in particular.

(5) The power converter described in (3) or (4), in which the first signal terminal and the second signal terminal extend from outermost sides of each of the semiconductor modules in the planar direction.

According to the power converter described in (5), the influence of the conductive members decreases and noise is reduced due to the terminals extending from the outermost sides in the power converter described in (3) or (4) in particular.

(6) The power converter described in one of (1) to (4), in which the conductive members are partially exposed from the resin sealing part.

According to the power converter described in (6), a cooling effect can be improved in the power converter described in one of (1) to (4) in particular.

(7) The power converter described in one of (1) to (6), which further includes: a frame member (e.g., a frame member 400 which will be described below) that connects the support media, in which the support media are disposed to face each other with the cooler interposed therebetween, and the support media and the frame member are fastened by bolts (e.g., fastened by a plurality of bolts 410 which will be described below).

According to the power converter described in (7), a fixing force of the semiconductor modules is reinforced by fastening forces of the bolts particularly in the power converter described in one of (1) to (6).

According to the present invention, it is possible to realize a power converter in a small size having excellent vibration resistance in which an overhang of power modules protruding from a portion sandwiched by a holding structure can be reduced and by which the influence of noise can be minimized.

DESCRIPTION OF THE EMBODIMENTS

The present invention will be introduced below by describing a power converter as an embodiment of the present invention with reference to the drawings. First, the power converter of the embodiment of the present invention will be described in detail with reference to FIGS. 1 to 3.

Figure 1:
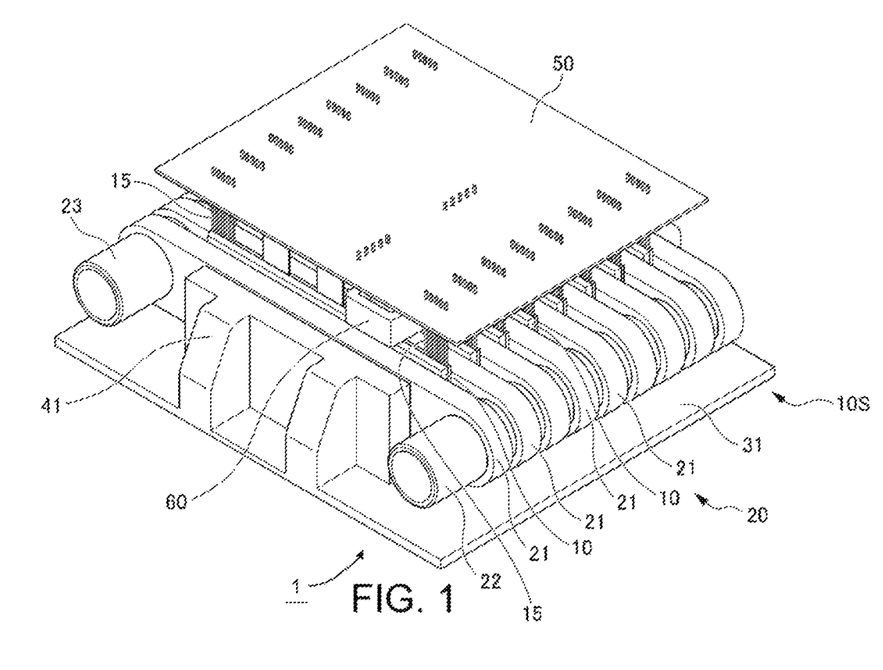
FIG. 1 is a perspective view showing a power converter as an embodiment of the present invention.
Figure 2:
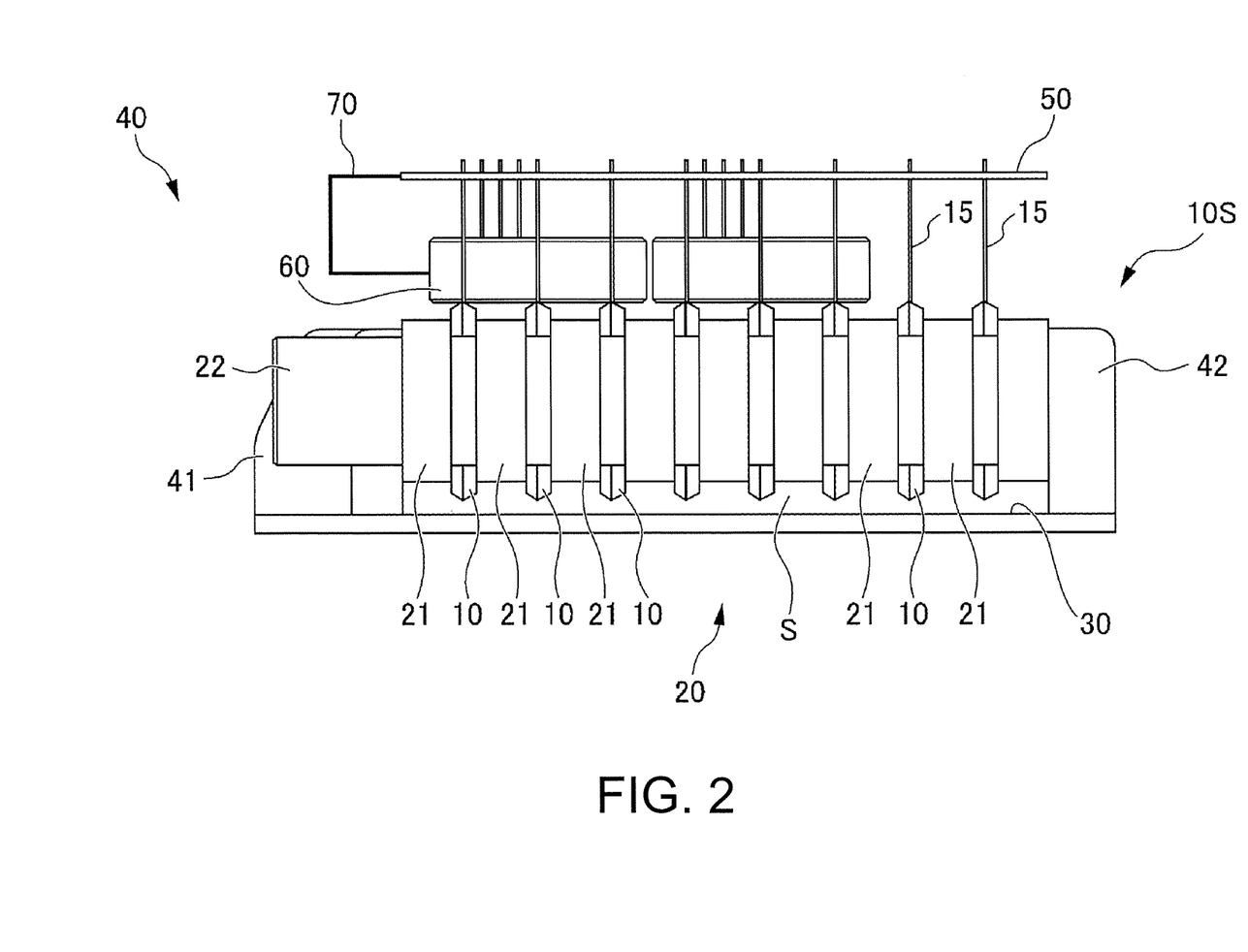
FIG. 2 is a side view of the power converter of FIG. 1.
Figure 3:
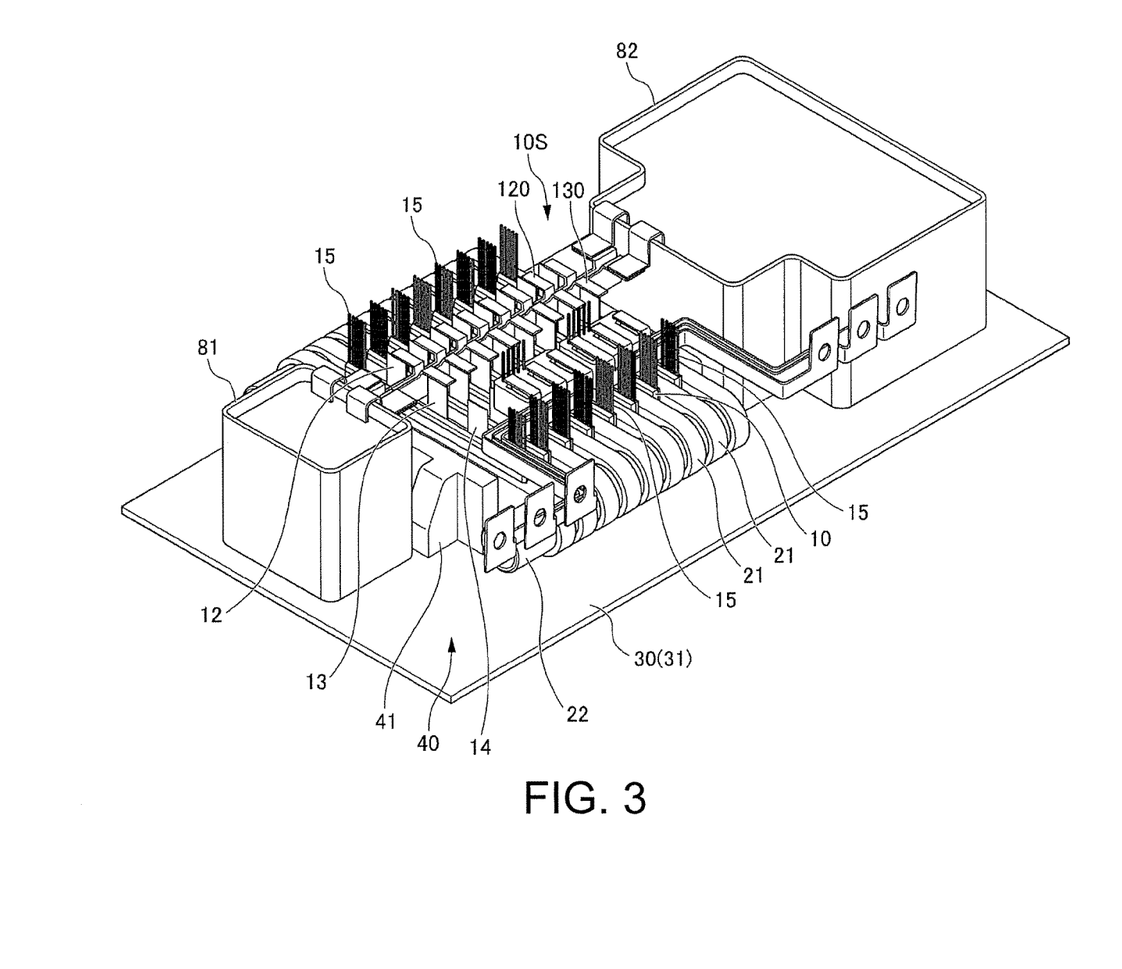
FIG. 3 is a perspective view showing a disposition of a conductor part of the power converter of FIG. 1.

FIGS. 1 to 3 are diagrams showing the power converter of the embodiment of the present invention, FIG. 1 is a perspective view of the power converter, FIG. 2 is a side view of the power converter, and FIG. 3 is a perspective view showing a disposition of a conductor part of the power converter. The same reference numerals are given to corresponding portions in FIG. 1 to FIG. 3. The power converter 1 as an embodiment of the present invention includes semiconductor modules 10, a cooler 20, and a cover 30. That is, a plurality of power modules 10 which are planar semiconductor modules are disposed to be laminated such that each of the power modules 10 are interposed between a plurality of planar refrigerant tube parts 21 of the cooler 20 that are arranged in parallel. The power module 10 has a resin sealing part 16 in which a semiconductor chip 11 that is a semiconductor element as will be described below, and conductive members 12, 13, and 14, and signal terminals 15 are sealed with a resin. The conductive members 12, 13, and 14, and the signal terminals 15 of the power module 10 are collectively called an external connection conductor which connects the semiconductor chip 11 provided therein to an external device or conductor.

The cooler 20 is configured with a refrigerant circulation flow passage in which a refrigerant supplied from the refrigerant supply tube 22 is divided and distributed to the plurality of planar refrigerant tube parts 21 that are arranged in parallel and then is discharged from a refrigerant discharge tube 23. The cover 30 is provided to cover at least a part of the above-described power modules 10 and the cooler 20 from outside. In FIG. 1 and FIG. 3, a bottom plate part 31 which is a part of the cover 30 is shown. Each refrigerant tube part 21 of the resin sealing part 16 and the cooler 20 of each power module 10 is supported such that a facing part of the refrigerant tube part 21 with respect to the cover 30 is positioned in proximity to the cover 30. That is, since a laminate of the resin sealing part 16 and the refrigerant tube parts 21, and the bottom plate part 31 are supported to face each other in proximity to each other in a state in which a facing surface of the laminate with respect to the bottom plate part 31 can approach the upper face of the bottom plate part 31 without an obstruction, the external connection conductor of the power module 10 is not present in a space S between the laminate and the upper face of the bottom plate part 31.

This support is implemented such that one support medium 41 and another support medium 42 constituting a support medium 40 extend upward from the bottom plate part 31 of the cover 30 such that at least a part of the laminate of the resin sealing part 16 and the refrigerant tube parts 21 is supported. The reason for the fact that the laminate can face the bottom plate part 31 in proximity to each other with no external connection conductor of the power module 10 in the space S as described above is that the following configuration is employed. That is, as illustrated, the conductive members 12, 13, and 14, and the signal terminals 15 which are external connection conductors of each of the power modules 10 protrude from the resin sealing part 16 in a direction away from (the bottom plate part 31 of) the cover 30 (the upward direction in the drawings). For this reason, it is not necessary to secure a space for preventing the external connection conductors of the power modules 10 from interfering with the bottom plate part 31 of the cover 30, and thus an overhang that is an amount by which the external connection conductors (the conductive members 12, 13, and 14) of the power modules 10 protrude from the laminated refrigerant tube parts 21 to a lower side can be made small.

Vibration resistance can be improved if an overhang is small as described above. Accordingly, it is possible to prevent the power modules or the cooler from being broken due to deviation of the power modules 10 from normal positions or becoming brittle due to vibration. The signal terminals 15 among the external connection conductors protruding to the upper side of the power modules 10 are respectively connected to corresponding predetermined parts of the control board 50 that is disposed above an assembly 10S which is a laminate of the power modules 10 and the refrigerant tube parts 21, i.e., in the protruding direction of the signal terminals 15.

As shown in FIG. 1 and FIG. 2, a current sensor 60 is disposed between the refrigerant tube parts 21 of the cooler 20 and the control board 50. The current sensor 60 is connected to one kind of the conductive members (which is out-buses 14 that will be described below) of each power module 10 (specifically, the current sensor is mounted to surround the conductive members), and the current sensor 60 and the control board 50 are connected to each other by the harness 70. By disposing the current sensor 60 and the control board 50 in proximity to each other in the above-described layout, the harness 70 can be shortened, and further noise included in a signal that propagates through the harness 70 can be reduced.

Figure 4:
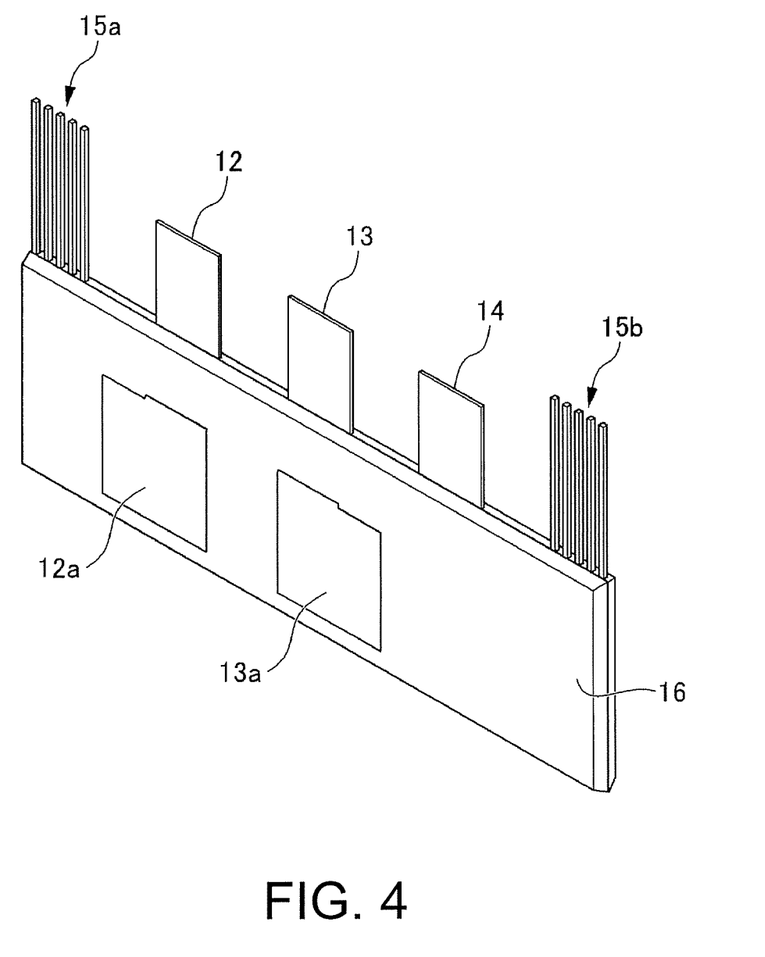
FIG. 4 is a perspective view of a semiconductor module which is a constituent element of the power converter of FIG. 1.
Figure 5:
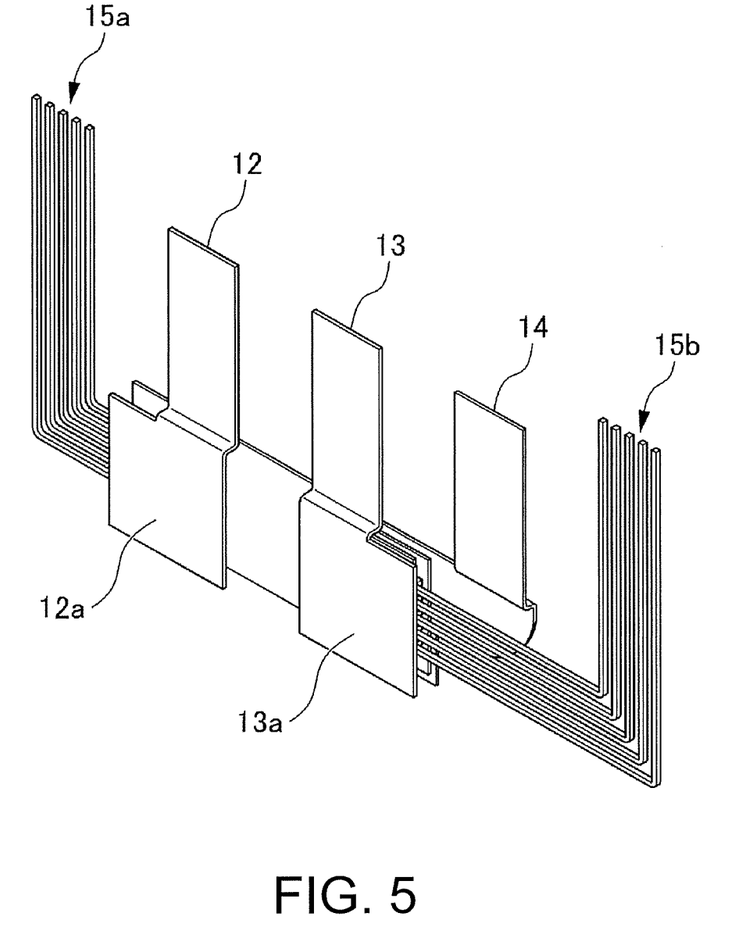
FIG. 5 is a perspective view showing conductive members and signal terminals included in the semiconductor module of FIG. 4.
Figure 6:
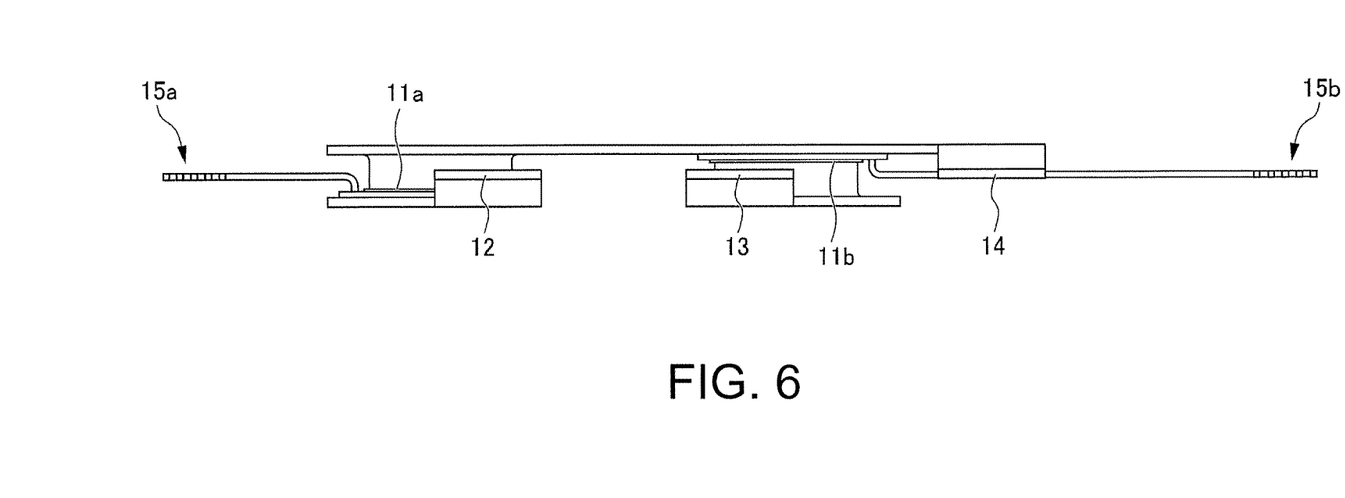
FIG. 6 is a plan view showing the conductive member and the signal terminals included in the semiconductor module of FIG. 4.

Next, the power module 10 and the external connection conductors will be described with reference to FIGS. 4 to 6, in addition to FIGS. 1 to 3 described above. FIG. 4 is a perspective view of the power module 10, FIG. 5 is a perspective view showing the conductive members and signal terminals included in the power module 10, and FIG. 6 is a plan view showing the signal terminals included in the power module 10. The semiconductor chip 11 that is a semiconductor element in the power module 10 includes a first semiconductor chip 11a that is a first semiconductor element and a second semiconductor chip 11b that is a second semiconductor element. In addition, the three conductive members 12, 13, and 14 among the external connection conductors are bus bar or buses in the following description. That is, the conductive member 12 is a positive conductive member (a P busbar). The conductive member 13 is a negative conductive member (an N busbar). The conductive member 14 is an output conductive member (an out-bus). On the other hand, the signal pins 15 that serve as signal terminals among the external connection conductors include a first signal pin 15a that drives the first semiconductor chip 11a and a second signal pin 15b that drives the second semiconductor chip 11b.

As can be easily understood with reference to FIGS. 4 to 6, the P busbar 12, the N busbar 13, the out-bus 14, the first signal pin 15a, and the second signal pins 15b are arranged in a planar direction of the resin sealing part 16 of the planar power module 10, i.e., in a principal surface direction. Thus, resin sealing using a mold is simple in the power module 10 of the present embodiment.

Figure 7A:
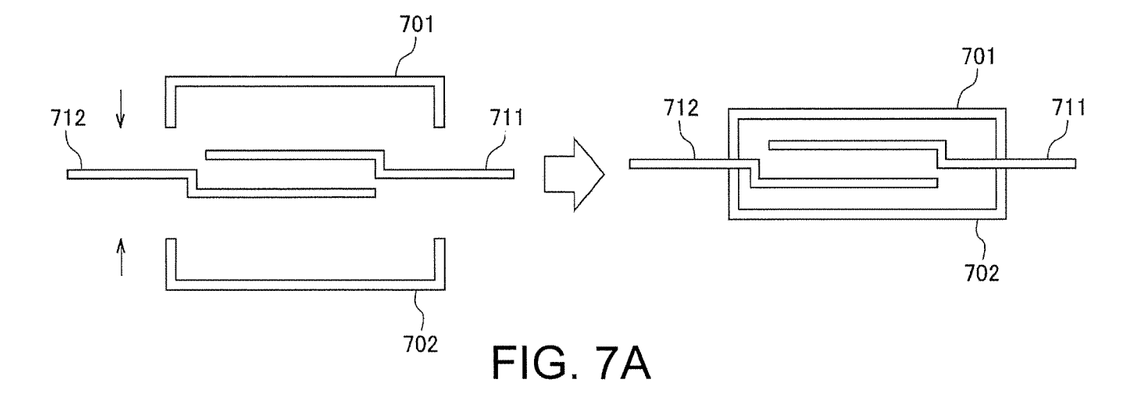
FIGS. 7A and 7B are conceptual diagrams showing the semiconductor module of FIG. 4 manufactured by sealing the conductive members and the signal terminals with a resin.
Figure 7B:
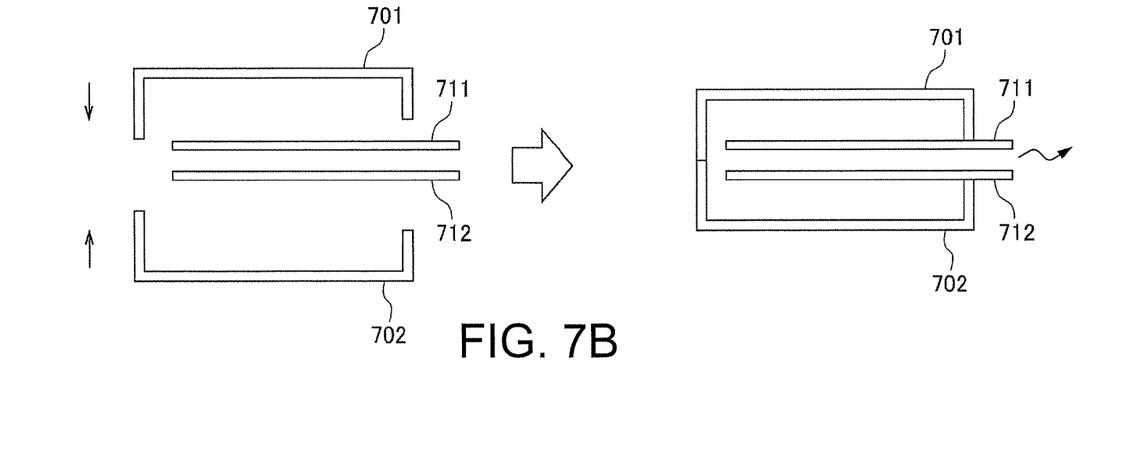

This point will be described next with reference to FIGS. 7A and 7B. FIGS. 7A and 7B are conceptual diagrams showing the semiconductor module (the power module 10) of FIG. 4 manufactured by sealing the conductive members and the signal terminals with a resin. FIG. 7A is a conceptual diagram showing a benefit gained when the power module 10 which is a constituent element of the present invention is manufactured through resin sealing using molds. FIG. 7B is a conceptual diagram showing a benefit gained when a general power module is manufactured through resin sealing using molds. For the sake of convenience for description, external connection conductors of the power modules are represented by reference numerals 711 and 712 in the conceptual diagrams of FIG. 7A and FIG. 7B.

In the power module 10 applied to the present invention, the P busbar 12, the N busbar 13, the out-bus 14, the first signal pin 15a, and the second signal pins 15b, which are the external connection conductors of the power module 10, are arranged in the planar direction of the resin sealing part 16 of the planar power module 10, i.e., in the principal surface direction as described above with reference to FIGS. 4 to 6. Thus, when the power module 10 is manufactured by being interposed between molds 701 and 702 and sealed with a resin, openings through which the external connection conductors come out are aligned with planes thereof. Conceptually, the external connection conductors 711 and 712 face each other in the in-plane direction. For this reason, split surfaces of the molds 701 and 702 meet as shown in FIG. 7A, and thus the resin does not leak out during resin sealing.

On the other hand, when the general power module is manufactured through resin sealing using molds, openings through which the external connection conductors 711 and 712 of the power module 10 come out are not aligned with planes thereof. For this reason, split surfaces of the molds 701 and 702 do not meet as shown in FIG. 7B, and thus the resin leaks out during resin sealing. As is obvious from the above description, resin sealing using molds is simple in the power module 10 applied to the power converter 1 of the present invention.

Next, the disposition of the conductor part of the power converter will be described again with reference to FIG. 3. In the power converter 1, a first capacitor 81 and a second capacitor 82 are used in tandem, and positive electrodes of the capacitors 81 and 82 and the P busbar 12 of each of the plurality of power modules 10 are connected to each other by a capacitor positive conductive member 120 as illustrated. In addition, the negative electrodes of the parallel body of the first capacitor 81 and the second capacitor 82 and the N busbar 13 of each of the plurality of power modules 10 are connected to each other by a capacitor negative conductive member 130. The capacitor positive conductive member 120 and the capacitor negative conductive member 130 extend in the laminating direction of the laminate of the resin sealing part 16 and the refrigerant tube parts 21 facing each other.

Furthermore, disposition characteristics of the first signal pin 15a and the second signal pin 15b of each power module 10 will be described with reference to FIGS. 3 to 6. As is easily understood from the drawings, the first signal pin 15a and the second signal pin 15b extend from outermost sides of the power module 10 in the planar direction. For this reason, the influence of a magnetic field generated by a current flowing through the P busbar 12, the N busbar 13, and the out-bus 14 is reduced, and accordingly noise is diminished.

Here, characteristics of the power module 10 of the present embodiment will be described with reference to FIG. 4 again. As will be easily understood with reference to FIG. 4, the power module 10 of the present embodiment has a cooling contact face 12a that is a part of the P busbar 12 and a cooling contact face 13a that is a part of the N busbar 13 being exposed from one side face of the planar resin sealing part 16. These cooling contact faces 12a and 13a are brought in contact with the planar refrigerant tube parts 21 of the cooler 20 via an insulating heat transfer sheet (not shown). Since the P busbar 12 and the N busbar 13 that are conductive members radiating a large amount of heat during operations are partially brought in contact with the refrigerant tube parts 21 via the insulating heat transfer sheet without passing through the resin sealing part 16, a cooling effect can be improved.

Figure 8:
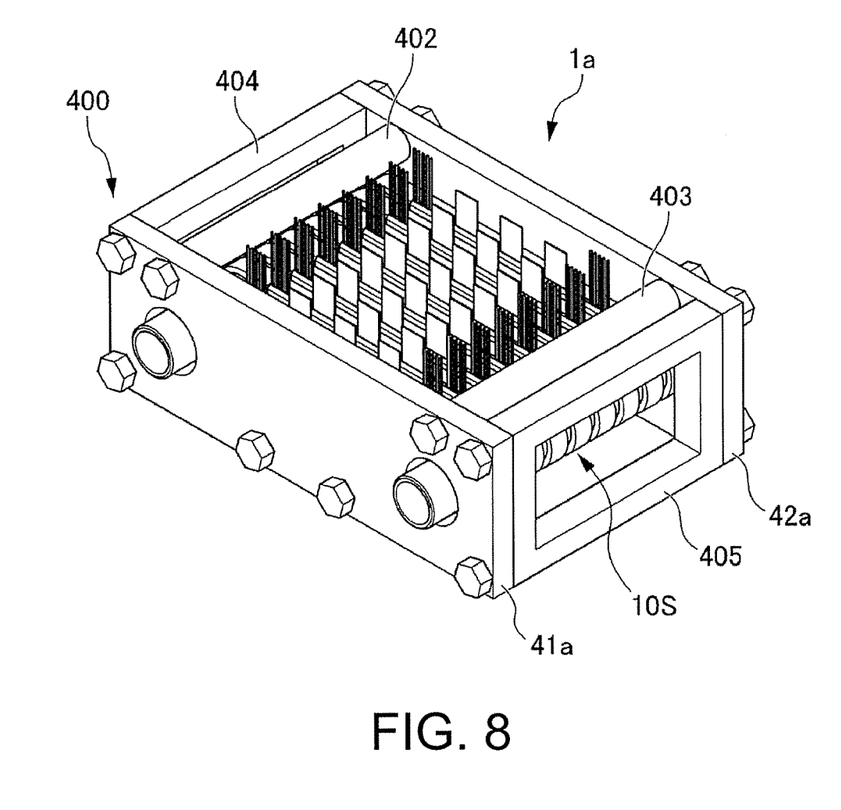
FIG. 8 is a perspective view showing a power converter as another embodiment of the present invention.
Figure 9:
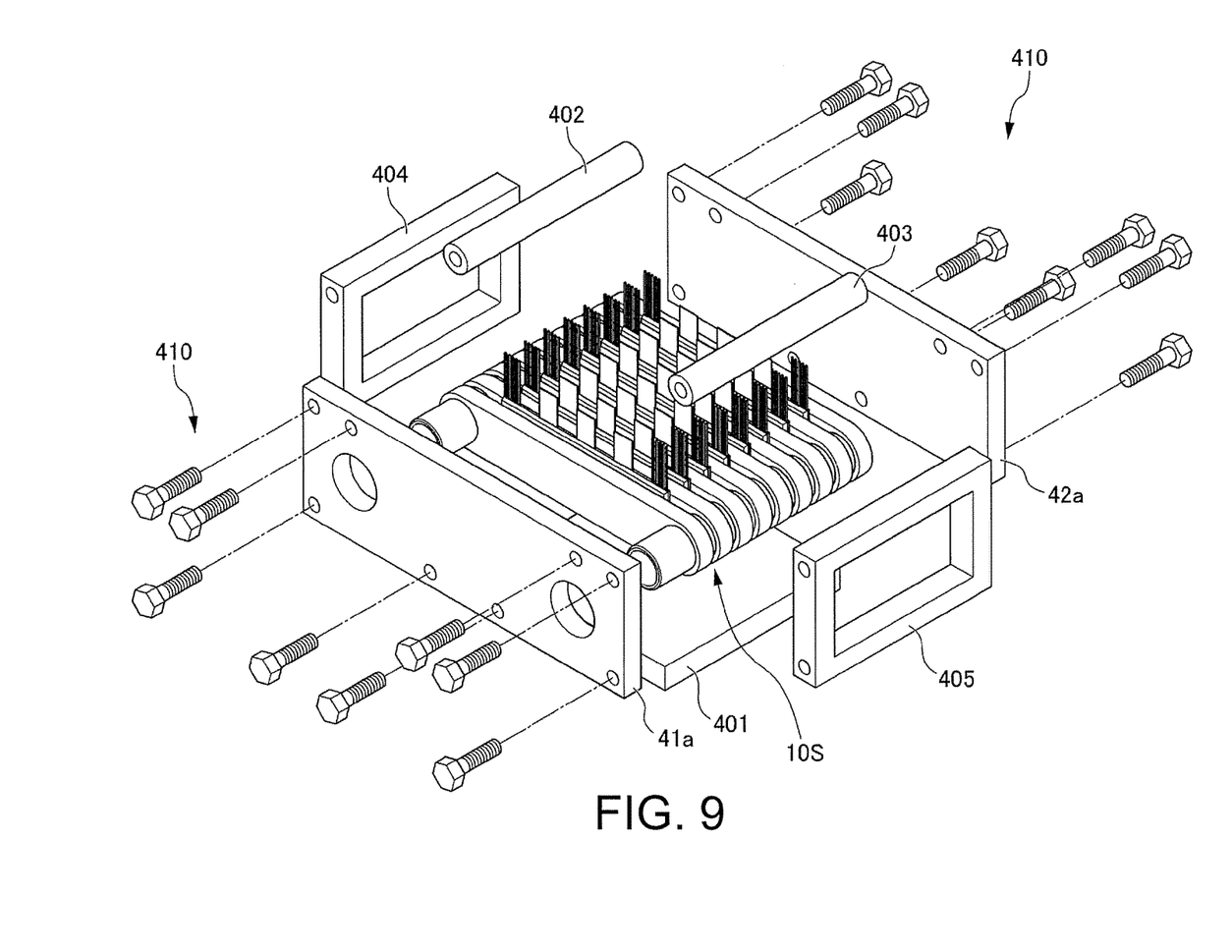
FIG. 9 is a perspective view showing assembly of the power converter of FIG. 8.

Next, a power converter as another embodiment of the present invention will be described with reference to FIGS. 8 and 9. FIG. 8 is a perspective view showing the power converter as another embodiment of the present invention. FIG. 9 is a perspective view showing assembly of the power converter of FIG. 8. The power converter 1a of FIGS. 8 and 9 is configured such that end plates 41a and 42a, which face each other, are fastened with a frame member 400 to be integrated with an assembly 10S that is a laminate of a plurality of power modules 10 and a plurality of refrigerant tube parts 21, which is similar to that described above with reference to FIGS. 1 to 3, as a whole. The end plates 41a and 42a facing each other correspond to one support medium 41 and the other support medium 42 described above. In addition, the frame member 400 is configured to include a bottom plate 401, two upper rod-shaped members 402 and 403, and a pair of side frame members 404 and 405. The power converter 1a is configured as an integrated body as a whole since both the end plates 41a and 42a are fastened to each other using a plurality of bolts 410 via the upper rod-shaped members 402 and 403 and the pair of side frame members 404 and 405 of the frame member 400. In the power converter 1a of FIGS. 8 and 9, a fixing force of the semiconductor modules (the assembly 10S that is a laminate of the plurality of power modules 10 and the plurality of refrigerant tube parts 21) is reinforced due to the fastening forces of the bolts.

The effects of the above-described power converter of the embodiment will be summarized. (1) The power converter 1 includes the planar power modules 10 each having the resin sealing part 16 in which the semiconductor chip 11, the conductive members 12, 13, and 14, and the signal terminals 15 are sealed with a resin, the cooler 20 having the plurality of refrigerant tube parts 21 which hold the plurality of power modules 10 in a laminated manner, and the cover 30 having the bottom plate part 31 that covers the power modules 10 and the cooler 20. The resin sealing part 16 and the cooler 20 having the plurality of refrigerant tube parts 21 are supported such that the facing surface of the laminate of the refrigerant tube parts 21 with respect to the bottom plate part 31 face each other in proximity to each other in a state in which none of the external connection conductors of the power modules 10 are present in the space S formed between the facing surface of the laminate and the upper surface of the bottom plate part 31. Further, the conductive members 12, 13, and 14, and the signal terminals 15 protrude from the resin sealing part 16 in the direction away from the cover 30. For this reason, the conductive members 12, 13, and 14, and the signal terminals 15 extend in the direction away from the cover 30, the resin sealing part 16 and the cooler 20 (the refrigerant tube parts 21) can be disposed in proximity to the cover preventing the external connection conductors of the power modules 10 from interfering in the cover 30, accordingly, an overhang thereof can be small, and vibration resistance can be improved. That is, it is possible to prevent the power modules 10 or the cooler 20 (the refrigerant tube parts 21) from being broken due to deviation of the power modules 10 from normal positions or becoming brittle due to vibration.

(2) The power converter 1 further includes the control board 50 that is disposed in the protruding direction of the signal pins 15 and controls driving of the power modules 10 and the current sensor 60 that is disposed between the cooler 20 and the control board 50, the current sensor 60 is connected to the out-buses 14 of the plurality of power modules 10, and the current sensor 60 and the control board 50 are connected by the harness 70. Thus, the harness 70 can be shortened by disposing the current sensor 60 and the control board 50 in proximity to each other, and consequently noise of a signal propagating through the harness 70 can be reduced.

(3) In the power converter 1, the semiconductor chip 11 includes two chips that are the first semiconductor chip 11a and the second semiconductor chip 11b, the conductive members include the P busbar 12, the N busbar 13, and the out-bus 14, and the signal terminals 15 include the first signal pin 15a that drives the first semiconductor chip 11a and the second signal pin 15b that drives the second semiconductor chip 11b, and the constituent elements are arranged in the planar direction. Accordingly, resin sealing using molds is simple.

(4) The power converter 1 includes the capacitor positive conductive member 120 which connects the positive electrodes of the parallel connection body of the first capacitor 81 and the second capacitor 82 to the positive conductive terminals of the positive conductive members of the plurality of power modules 10, the capacitor negative conductive member 130 which connects the negative electrodes of the parallel connection body of the first capacitor 81 and the second capacitor 82 and the negative conductive terminals of the negative conductive members of the plurality of power modules 10, and the capacitor positive conductive member 120 and the capacitor negative conductive member 130 extend in the laminate direction facing each other. Accordingly, by disposing the capacitor positive conductive member 120 and the capacitor negative conductive member 130 to face each other, a magnetic field generated by a current flowing through both of the conductive members can be differentiated, inductance is eliminated, and therefore emission of noise is reduced.

(5) In the power converter 1, the first signal pin 15a and the second signal pin 15b extend from the outermost sides of each of the power modules 10 in the planar direction. Accordingly, the influence of a current flowing through the P busbar 12, the N busbar 13, and the out-bus 14 that are conductive members decreases, and thus noise is reduced.

(6) In the power converter 1, the P busbar 12 and the N busbar 13 that are the conductive members are partially exposed from the resin sealing part 16. Accordingly, the P busbar 12 and the N busbar 13 are brought in contact with the refrigerant tube parts 21 of the cooler 20 without passing through the resin sealing part 16, and thus a cooling effect is improved.

(7) In the power converter 1, the end plates 41*a* and 42*a* are disposed to face each other with the assembly 10S, which is a laminate of the plurality of power modules 10 and the plurality of refrigerant tube parts 21, interposed therebetween, the frame member 400 which connects the end plates 41*a* and 42*a* is further provided, and the end plates 41*a* and 42*a* and the frame member 400 are fastened by the plurality of bolts 410. Accordingly, a fixing force of the semiconductor modules is reinforced by fastening forces of the bolts.

Various kinds of modifications and alterations that do not depart from the gist of the present invention as well as the above-described embodiments fall within the range of the present invention. For example, although the above-described power converter of the present invention has been described with the external connection conductors of the power modules 10 all protruding in the upward direction, it is not necessary for the external connection conductors of the power modules 10 to be in the described mode, and a mode in which the first signal pin 15*a* and the second signal pin 15*b* first protrude from sides of the resin sealing part 16 and then bend in the upward direction can also be employed.

What is claimed is:

1. A power converter comprising:
   planar semiconductor modules each having a resin sealing part in which a semiconductor element, conductive members, and a signal terminal are sealed with a resin;
   a cooler that holds the semiconductor modules in a laminated manner; and
   a cover that covers the semiconductor modules and the cooler,
   wherein at least a part of the resin sealing part and the cooler are supported by support media that extend from the cover so that facing parts of the resin sealing part and the cooler with respect to the cover is positioned in proximity to the cover,
   the conductive members and the signal terminal protrude from the resin sealing part in a direction away from the cover,
   a control board disposed in a protruding direction of the signal terminal to control driving of the semiconductor modules; and
   a current sensor that is disposed between the cooler and the control board,
   wherein the current sensor is connected to the conductive members of the semiconductor modules, and
   the current sensor and the control board are connected by a harness.

2. The power converter according to claim 1,
   wherein the semiconductor element includes two semiconductors that are a first semiconductor element and a second semiconductor element,
   the conductive members include a positive conductive member, a negative conductive member, and an output conductive member, and
   the signal terminal includes a first signal terminal that drives the first semiconductor element and a second signal terminal that drives the second semiconductor element, wherein the positive conductive member, the negative conductive member, the output conductive member, the first signal terminal and the second signal terminal are arranged in a planar direction.

3. The power converter according to claim 2, further comprising:
   a capacitor positive conductive member that connects positive electrodes of capacitors and a positive conductive terminal of the positive conductive member of each of the semiconductor modules; and
   a capacitor negative conductive member that connects negative electrodes of the capacitors and a negative conductive terminal of the negative conductive member of each of the semiconductor modules,
   wherein the capacitor positive conductive member and the capacitor negative conductive member extend in a laminating direction of the semiconductor module and the cooler, and the capacitor positive conductive member and the capacitor negative conductive member face each other.

4. The power converter according to claim 3, wherein the first signal terminal and the second signal terminal extend from outermost sides of each of the semiconductor modules in the planar direction.

5. The power converter according to claim 3, wherein the conductive members are partially exposed from the resin sealing part.

6. The power converter according to claim 2, wherein the first signal terminal and the second signal terminal extend from outermost sides of each of the semiconductor modules in the planar direction.

7. The power converter according to claim 2, wherein the conductive members are partially exposed from the resin sealing part.

8. The power converter according to claim 2, further comprising:
   a frame member that connects the support media,
   wherein the support media are disposed to face each other with the cooler interposed therebetween, and
   the support media and the frame member are fastened by bolts.

9. The power converter according to claim 1, wherein the conductive members are partially exposed from the resin sealing part.

10. The power converter according to claim 1, further comprising:
    a frame member that connects the support media,
    wherein the support media are disposed to face each other with the cooler interposed therebetween, and
    the support media and the frame member are fastened by bolts.

* * * * *